(12) United States Patent
Yamada

(10) Patent No.: US 8,653,527 B2
(45) Date of Patent: Feb. 18, 2014

(54) THIN FILM TRANSISTOR AND METHOD FOR MANUFACTURING THE SAME

(75) Inventor: Jun Yamada, Ibaraki (JP)

(73) Assignee: Konica Minolta Holdings, Inc., Tokyo (JP)

( * ) Notice: Subject to any disclaimer, the term of this patent is extended or adjusted under 35 U.S.C. 154(b) by 0 days.

(21) Appl. No.: 13/256,214

(22) PCT Filed: Mar. 5, 2010

(86) PCT No.: PCT/JP2010/053644
§ 371 (c)(1),
(2), (4) Date: Sep. 12, 2011

(87) PCT Pub. No.: WO2010/104005
PCT Pub. Date: Sep. 16, 2010

(65) Prior Publication Data
US 2012/0007092 A1    Jan. 12, 2012

(30) Foreign Application Priority Data

Mar. 13, 2009   (JP) ................................. 2009-061064

(51) Int. Cl.
| H01L 29/04 | (2006.01) |
| H01L 29/08 | (2006.01) |
| H01L 29/10 | (2006.01) |
| H01L 29/76 | (2006.01) |
| H01L 29/15 | (2006.01) |

(52) U.S. Cl.
USPC .................. 257/60; 257/40; 257/57; 257/66; 257/72

(58) Field of Classification Search
USPC .......... 257/60, 66, 72, 40, 57, 59, 99; 438/48, 438/99, 139, 149, 158, 780
See application file for complete search history.

(56) References Cited

U.S. PATENT DOCUMENTS

| 6,821,811 | B2 * | 11/2004 | Hirakata et al. ................ 438/82 |
| 2007/0120111 | A1 * | 5/2007 | Nakamura et al. ............. 257/40 |
| 2008/0121875 | A1 * | 5/2008 | Kim ................................ 257/40 |
| 2008/0290339 | A1 * | 11/2008 | Nakatani et al. ................ 257/40 |
| 2010/0032660 | A1 * | 2/2010 | Nomoto et al. ................. 257/40 |

FOREIGN PATENT DOCUMENTS

| JP | 2000-353594 | 12/2000 |
| JP | 2006-114862 | 4/2006 |
| JP | 2007-036259 | 2/2007 |
| JP | 2009-010332 | 1/2009 |
| WO | WO 2009/077740 A1 * | 6/2009 ............. H01L 51/05 |

* cited by examiner

Primary Examiner — Long K Tran
Assistant Examiner — Dzung Tran
(74) Attorney, Agent, or Firm — Cozen O'Connor

(57) ABSTRACT

Disclosed is a method for manufacturing a thin film transistor in which a semiconductor film in a channel portion is provided between a source electrode and a drain electrode, wherein a partition layer (a bank) can be appropriately formed. The method comprises the steps of: forming two underlying electrodes on an underlying layer; forming a partition layer on the surface of the underlying layer containing the two underlying electrodes so as to surround an area where the source electrode and the drain electrode are to be formed; forming the source electrode and the drain electrode by a plating method on the surfaces of the two underlying electrodes, which are surrounded by the partition layer; and applying semiconductor solution, in which a semiconductor material is dissolved or dispersed, to the area surrounded by the partition layer so that a semiconductor film is formed in the area.

28 Claims, 5 Drawing Sheets

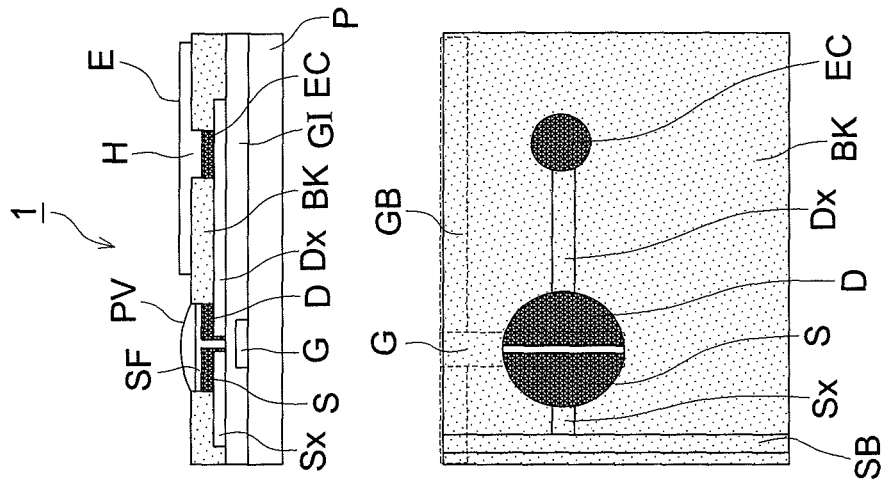
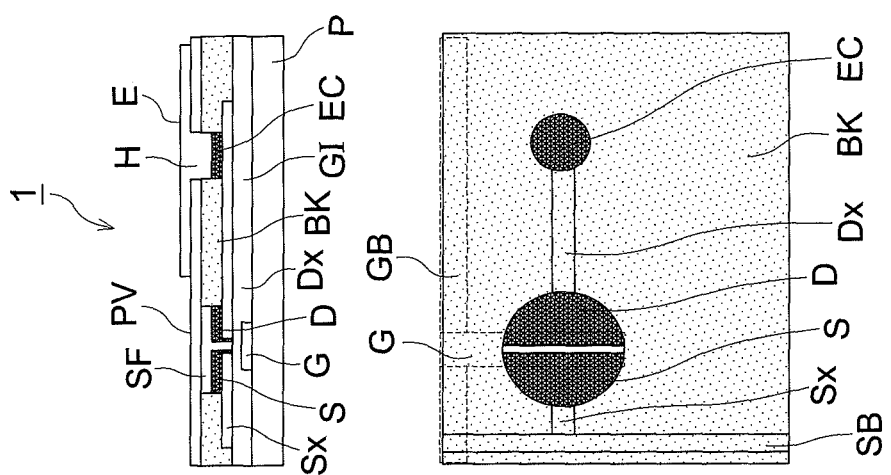
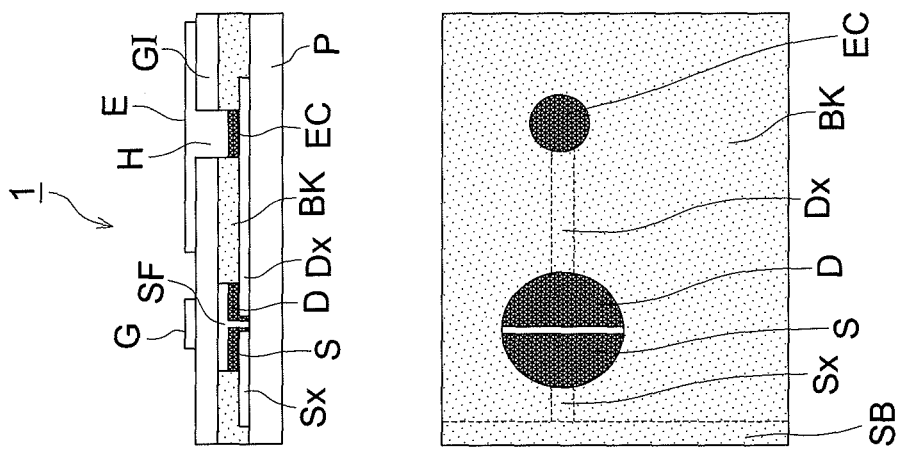

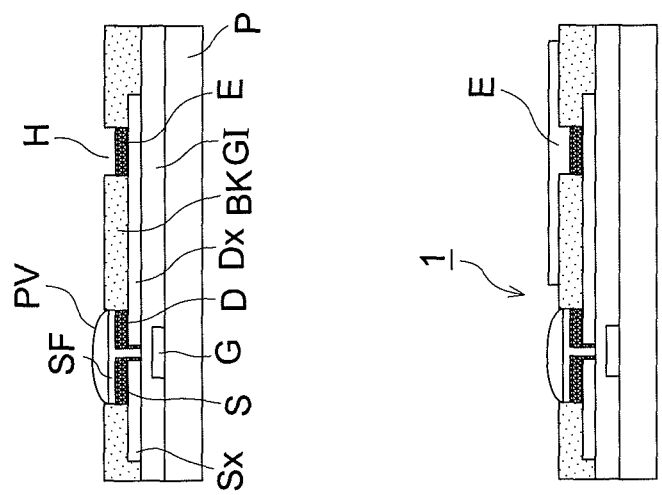
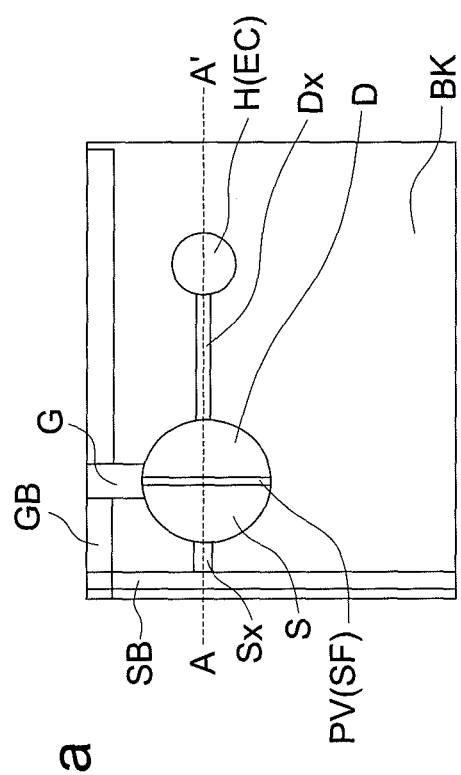
FIG. 5a
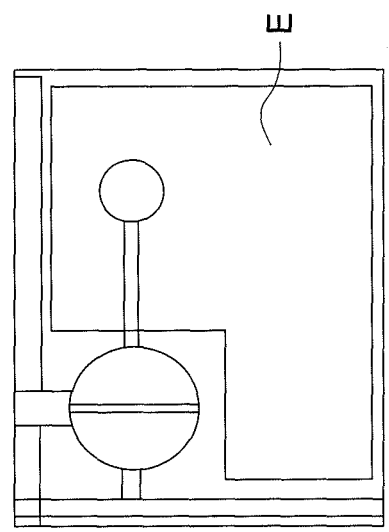
FIG. 5b

THIN FILM TRANSISTOR AND METHOD FOR MANUFACTURING THE SAME

RELATED APPLICATIONS

This is a U.S. National Phase under 35 U.S.C. §371 of International Application No. PCT/JP2010/053644, filed on Mar. 5, 2010, and claims the priority of Japanese application No. 2009-061064, filed on Mar. 13, 2009, the entire content of which is hereby incorporated by reference.

TECHNICAL FIELD

The present invention relates to a method for manufacturing a thin film transistor, and a thin film transistor, particularly to a method for manufacturing a thin film transistor wherein a semiconductor solution is applied to form a semiconductor film, and relates to a thin film transistor.

BACKGROUND ART

In recent years, there has been a drastic advance in the technique of manufacturing a thin film transistor (hereinafter referred to as "TFT") on a substrate. In particular, efforts of development have been made to apply this technology to the drive element for an active matrix large-screen display apparatus. The Si-based inorganic materials such as a-Si or poly-Si are used as semiconductor materials to manufacture TFTs which are currently in commercial use. The production of TFTs using such inorganic materials requires use of a vacuum process and high-temperature process, which processes have a great impact on the production cost.

To solve these problems, studies have been made to produce TFTs using organic materials (hereinafter also referred to as "organic TFT") in recent years. Compared to inorganic materials, organic materials are characterized by a wide variety of options. In the production of organic TFTs, processes of excellent productivity such as a printing or coating process are used, instead of the above-mentioned vacuum process or high-temperature process. Therefore, the production cost is reduced. Further, organic TFTs can be formed on a flexible and less heat-resistant substrate exemplified by a plastic film, and is expected to be used to a wide range of field including a display with curved surface.

The conventional method for applying organic semiconductor materials includes liquid droplet applying techniques such as an inkjet method and a dispenser method, wherein the solution (hereinafter also referred to as "ink") containing organic semiconductor materials dissolved or dispersed therein is applied directly on the substrate. These techniques: (1) does not require a vacuum process; (2) does not waste the material; and (3) permits direct patterning. Thus, these techniques have an advantage of eliminating the need for an etching process, compared to the photolithography method.

To ensure excellent electric property and high degree of reliability in the aforementioned organic TFT, it is necessary to form an organic semiconductor film having an appropriate film thickness with high accuracy at a prescribed position. However, when the aforementioned inkjet method or dispenser method is used to form an organic semiconductor film, before the applied ink gets dried and solidifies, it may spread, depending on the surface condition of the substrate (liquid-repellent or lyophilic properties) or drying atmosphere, to surrounding unwanted portions. When this happens, patterning failure will occur and sufficient film thickness cannot be obtained, with the result that excellent properties of organic TFT cannot be provided. To solve this problem, measures should be taken to prevent the applied ink from spreading out of prescribed regions.

In recent years, techniques using a droplet application technique have been studied, using an inorganic material or precursor as semiconductor materials. However, similarly to the case of the organic material, it is not easy to form a semiconductor film with appropriate thickness at a prescribed position with high accuracy either in this case.

Patent Document 1 discloses a thin film forming technique suitable for methods for producing organic EL elements using an organic semiconductor film, wherein a bank is provided on the edge of the region to which liquid material is applied to prevent the inkjet liquid droplet from flowing out of the applied region.

PRIOR ART DOCUMENT

Patent Document

Patent Document 1: Japanese Registration Patent No. 3692524

SUMMARY OF THE INVENTION

Problem to be Solved by the Invention

However, when the technique disclosed in the Patent Document 1 is applied to a method for producing TFTs, a problem arises in a step of forming a bank. To be more specific, in the case of TFT, the materials for the source and drain electrodes are on the substrate on which the bank is formed, and the bank must be thus formed on different materials including the substrate and the electrodes. In the meantime, the bank is preferably made of an ink-repellent material, which has a feature that it does not have good adhesion to other materials. This raises the problem that while the bank can be formed on the substrate, it cannot be formed on the electrode material, for example. This may prevent an appropriate bank from being formed, and the ink may thus wet and spread out of the application region.

In view of the problems described above, it is an object of the present invention to provide a method for manufacturing a thin film transistor with excellent productivity, wherein a partition layer (bank) can be appropriately formed, and to provide a thin film transistor.

Means to Solve the Problems the afore-mentioned objects are obtained according to any one of the following items.

Item 1. A method for manufacturing a thin film transistor having a semiconductor film on a channel portion between a source electrode and a drain electrode, the method comprising the steps of:

forming, on a surface of an underlying layer, a pair of underlying electrodes, wherein each of the source electrode and the drain electrode is to be formed on each surface of the pair of underlying electrodes;

forming, on a surface of the underlying layer including the pair of underlying electrodes, a partition layer such that the partition layer surrounds an area on the pair of underlying electrodes, in which area the source electrode and the drain electrode are to be formed;

forming the source electrode and the drain electrode on the surfaces of the pair of underlying electrodes surrounded by the partition layer, by using a plating method; and forming, after the source electrode and the drain electrode have been formed, a semiconductor film in the area surrounded by the partition layer by applying a semiconductor solution in which a semiconductor material is dissolve or dispersed.

Item 2. A method of item 1 for manufacturing a thin film transistor, wherein a material of the source electrode and the drain electrode contains Au.

Item 3. A method of item 2 for manufacturing a thin film transistor, wherein a material of the pair of underlying electrodes contains Ni.

Item 4. A method of any one of items 1 to 3 for manufacturing a thin film transistor, wherein the semiconductor solution is a solution in which an organic semiconductor material is dissolved.

Item 5. A method of any one of items 1 to 4 for manufacturing a thin film transistor, wherein the semiconductor solution is applied by an inkjet method.

Item 6. A method of any one of items 1 to 5 for manufacturing a thin film transistor, wherein a material of the underlying layer is organic material.

Item 7. A method of any one of items 1 to 6 for manufacturing a thin film transistor, wherein an area occupied by the source electrode, the drain electrode, and the channel portion has a substantially circular planar shape.

Item 8. A method of any one of items 1 to 7 for manufacturing a thin film transistor, wherein the thin film transistor has a top-gate bottom-contact structure, and the underlying layer is a substrate.

Item 9. A method of any one of item 1 to 7 for manufacturing a thin film transistor, wherein the thin film transistor has a bottom-gate bottom-contact structure, and the underlying layer is a gate insulation film covering a gate electrode.

Item 10. A method of any one of items 1 to 9 for manufacturing a thin film transistor, wherein the semiconductor solution is applied in a closed environment separated from an outside.

Item 11. A thin film transistor manufactured by a method of any one of items 1 to 10 for manufacturing a thin film transistor.

Means for Solving the Object

According to the present invention, a partition layer can be properly formed. This ensures formation of a semiconductor film having an appropriate thickness at a prescribed region with high accuracy. Further, a semiconductor solution is applied to form the semiconductor film with high productivity.

BRIEF DESCRIPTION OF THE DRAWINGS

FIGS. 2a, 2b, and 2c are schematic diagrams showing a schematic configuration of the TFT according to the present embodiment;

FIGS. 5a and 5b are schematic diagrams showing steps of manufacturing another type of a bottom-gate bottom-contact TFT according to the present embodiment

PREFERRED EMBODIMENT OF THE INVENTION

The following describes a TFT and a TFT manufacturing method according to an embodiment of the present invention with reference to the drawings. It should be noted, however, that, although the following description is based on the illustrated embodiments, the present invention is not limited to these embodiments.

Figure 1:
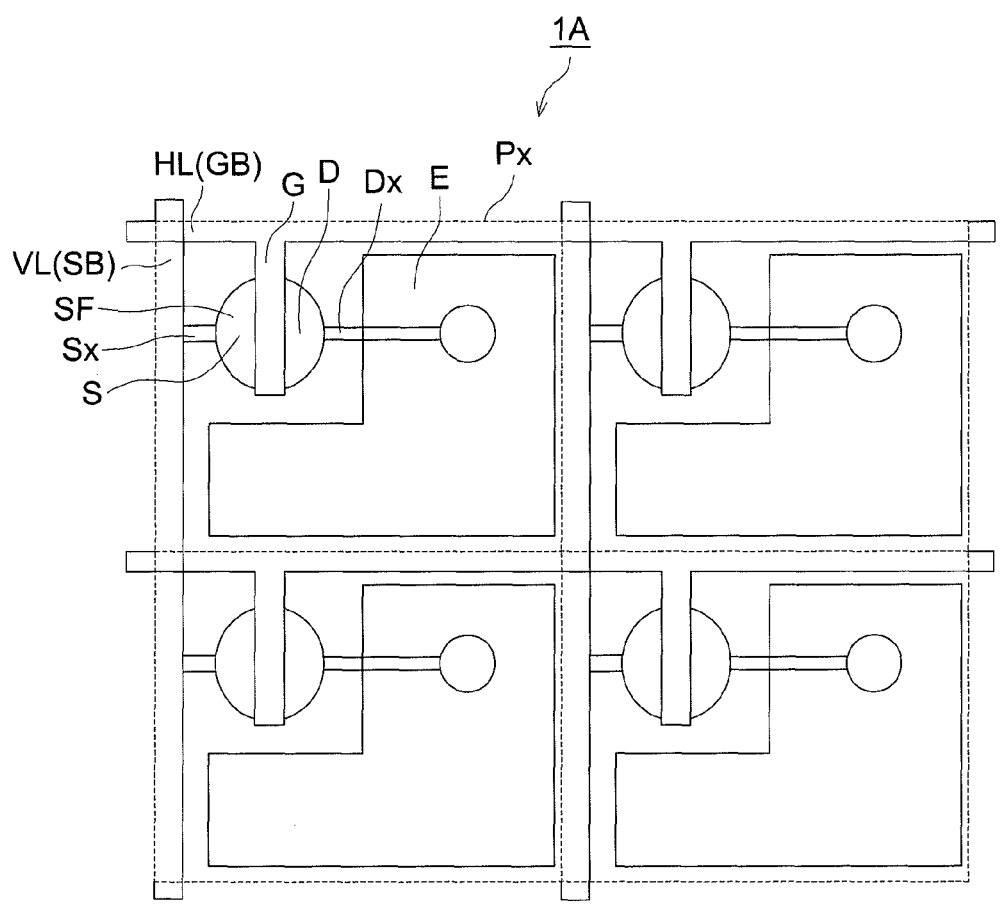
FIG. 1 is a plane schematic diagram showing a schematic configuration of a TFT array in an embodiment of the present invention.

FIG. 1 is a plane schematic diagram showing a schematic configuration of a top-gate bottom-contact TFT array 1A according to the present embodiment.

In the TFT array 1A, the pixels Px provided with TFT 1 are arranged in a two-dimensional matrix array, as shown in FIG. 1.

The pixels Px include a semiconductor film SF, gate electrode G, source electrode S, and drain electrode D, and the pixel electrode E connected to the drain electrode D, which constitute the TFT. Underlying electrodes Sx and Dx will be described later.

The TFT array 1A has row selection lines HL (hereinafter also referred to as "gate bus GB") and column signal lines VL (hereinafter also referred to as "source bus SB"). The row selection lines HL and column signal lines VL are connected to a row driver and a column driver (not illustrated), respectively, which drivers are for driving the TFT 1 in response to the image signal inputted from the outside. All the gate electrodes G of the pixels Px of a row corresponding to one row selection line HL are connected to that row selection line, and all the source electrodes S of the pixels Px of a column corresponding to one column signal line VL are connected to that column signal line.

The following describes the flow of the display control operation in the case where the TFT array 1A is applied to a display apparatus equipped with a display layer.

First, only one row on which display data is to be set is selected through the row selection line HL by the row driver. The row is selected by activating (turning on) the row selection line HL for the row to be selected, and inactivating (turning off) the other row selection lines HL. This is followed by the step of transferring the display data to the pixels Px through the column signal line VL by the column driver. In this situation, when the row selection line HL is inactivated, the signal transferred to the pixels Px is memorized, and the pixels Px apply voltages to the pixel electrodes E, to drive the display layer, through the drain electrodes D according to the memorized signal. A series of these operations are performed for all the rows to complete the display drive for one screen.

The following describes in detail the issues noticed by the inventor, in reference to the present embodiment.

Especially in the case of an organic TFT, Au (gold) is suitable as a material for a source electrode and a drain electrode. Regarding the current flowing to the drain electrode from the source electrode through the organic semiconductor film, there is a barrier of differences between the ionization potential of the organic semiconductor film and the work function of the source electrode and the drain electrode, at the interfaces between the organic semiconductor film and each of the source electrode and drain electrode. If this barrier is high, rate is limited by injection, and current does not flow even if the organic semiconductor film is capable of conveying the carrier, because the carrier cannot be injected from the source electrode or the drain electrode. In this respect, the source electrode and drain electrode made of Au have a large work function, and Au is a suitable material for an organic semiconductor.

However, Au is a material which does not react well with other materials and does not have good adhesion to other materials. In the meantime, in order to form an organic semiconductor film on the channel portion between the source electrode and drain electrode, a liquid-repellent partition layer is effectively used to surround its periphery Materials for this partition layer also have low surface energy and low adhesion; therefore, it is not easy to form a partition layer on the source electrode and drain electrode made of Au. By contrast, the channel portion is a place where a substrate or a gate insulation film is exposed, and is generally formed of an insulating material having relatively high adhesion to the partition layer. Therefore, on the surface on which the partition layer is to be formed, Au having low adhesion to the partition layer and the insulating material having higher adhesion to the partition layer are arranged side by side. For example, if patterning is performed under a condition that no partition layer remains on the gate insulation film of the channel portion, no partition layer will be formed on the source electrode and drain electrode, and even if the partition layer is formed, liquid-repellency will be insufficient. On the other hand, if a partition layer is formed on the source electrode and drain electrode so as to have enough adhesion, the partition layer material will remain on the highly adhesive gate insulation film. In this case, formation of a semiconductor film on the entire channel portion will be prevented by the partition layer material remaining on the channel portion. Accordingly, the semiconductor film cannot be formed all over the channel portion, and the formed semiconductor film has an area smaller than a prescribed shape and has a thickness greater than an appropriate thickness. Further, the Vth of the Id-Vg curve will be shifted due to the remaining partition layer material, for example, with the result that the characteristics of the organic TFT will be adversely affected.

Even if partition layer can be formed approximately in a uniform manner on the source electrode, drain electrode and gate insulation film, the stability may be different. For example, the liquid-repellency of the surface of the partition layer formed on the source electrode and drain electrode may be reduced when it is left in the atmospheric air. Thus, ink may flow onto the source electrode and drain electrode, with the result that the organic semiconductor film will not be formed in a prescribed shape. Further, to control the ink drying speed, the ambient environment may be made to be of ink solvent. The liquid-repellency of the surface of the partition layer formed on the source electrode and drain electrode tends to decrease more easily than that on the gate insulation film. Thus, in the similar manner, ink will flow onto the source electrode and drain electrode, and the semiconductor film will not be formed in a prescribed shape.

In the present embodiment, the aforementioned problems are solved by using the underlying electrodes Sx and Dx corresponding to the source electrode and drain electrode.

Referring to FIGS. 2a, 2b, and 2c, the following describes a schematic configuration of a TFT 1 constituting the pixels Px of the TFT array 1A in the present embodiment. FIG. 2a is a schematic view showing the schematic configuration of a top-gate bottom-contact TFT 1; FIG. 2b is a schematic view showing a schematic configuration of a bottom-gate bottom-contact TFT 1; and FIG. 2c is a schematic view showing the schematic configuration of another bottom-gate bottom-contact TFT 1. In FIGS. 2a through 2c, the upper drawings show a cross section, and the lower drawings show a schematic plane view of the transistor having been processed just before the step of forming the semiconductor film SF.

As shown in FIGS. 2a through 2c, the TFT 1 includes a substrate P, gate electrode G, gate insulation film GI, underlying electrodes Sx and Dx, source electrode S, drain electrode D, semiconductor film SF, protective film PV, pixel electrode E, and partition layer BK.

Suitable materials for the substrate P are exemplified by organic materials such as polyimide, polyamide, polyethylene terephthalate (PET), polyethylene naphthalate (PEN) and polyether sulfone (PES); glass; or insulator-coated conductive materials.

The gate electrode G, can be formed in such a manner that a film is formed of the gate electrode material by a sputtering method or a vapor deposition method, and the film is patterned by a photolithography method to make the gate electrode. Further, a shadow-mask vapor deposition method of an inkjet method can also be used to form the gate electrode G. The gate electrode G can be made of metal such as Al, Au, Ag, Pt, Pd, Cu, Cr, Mo, In, Zn, or Mg, oxide conductive materials such as ITO or ZnO, or conductive polymer such as PEDOT/PSS. A plurality of these materials can also be stacked on one another.

The gate insulation film GI can be formed by a sputtering method, vapor deposition method, CVD (chemical vapor deposition) method, spin coating method or inkjet method. The gate insulation film GI can be made of inorganic materials such as $SiO_2$ or SiN, and organic materials such as PVA, PVP, polyimide resin or novolak resin. Further, a plurality of these materials can be stacked on one another. The gate insulation film GI is preferably made of materials that can be applied so that the insulation film can be formed at the atmospheric pressure without using vacuum process, thereby reducing production costs. For this reason, organic materials that can be used at a low temperature to make a film are more preferable.

The underlying electrodes Sx and Dx are preferably made of metal, except a precious metal such as Au and Pt, that allows formation of the layers of the source electrode and drain electrode (preferably made of Au) on their surfaces by plating. Such a preferred material is considered to have a higher degree of adhesion to the material of the partition layer BK than the degree of adhesion of the material of the source electrode and drain electrode to the partition layer BK. Especially when Au is used to form the source electrode and drain electrode, Ni, which is suitable for plating on Au, is preferred. Other than Ni, a metal such as Cr, Cu, Ag or Pd can be used. To form the underlying electrodes Sx and Dx, direct patterning such as an inkjet method or transfer printing method is preferably employed. Further, after the underlying electrodes have been formed by using a sputtering method or a vapor deposition method, the photolithography method can be used to form a pattern.

Material, which are highly liquid-repellent to the solvent in which the semiconductor materials are dissolved or dispersed, can be used as the material for the partition layer BK. It is possible to use the polymer materials whose liquid-repellency is enhanced with fluorine-based or silicone-based liquid-repellent materials. In particular, use of the photosensitive resist material is preferred because easy pattern formation is ensured. The photosensitive resist material is exemplified by acryl, phenol, polyimide and PVA resins.

A non-photosensitive polymeric material can also be used to form the partition layer BK. Examples include an acryl, epoxy, polyimide, phenol, allyl, urethane or silicone resin. In this case, the polymeric material is applied to form a pattern by printing. After that, the surface is provided with liquid-repelling treatment, whereby the liquid-repellent layer CF can be formed. The liquid-repelling treatment is performed, for example, by a plasma treatment in a gaseous environment containing fluorine such as $SF_4$, $SF_6$, $C_2F_6$ or $CHF_3$. In this case, plasma treatment can be performed at a reduced pressure or at the atmospheric pressure.

To add liquid-repellency to the polymeric material of the partition layer BK, the polymeric material containing a liquid-repellent substituent can be used, instead of mixing the liquid-repellent material with the polymeric material as described above. Examples of the liquid-repellent substituent include a fluoroalkyl group, at least a part of which is replaced by fluorine.

Further, the partition layer BK can be either a film made of a monomolecular layer or a film made of a multi-molecular layer. The partition layer BK may have a thickness of several microns. The partition layer BK is preferred to have a high degree of adhesion to the layers underneath (substrate P, underlying electrodes Sx and Dx for the top-gate bottom-contact TFT 1, and gate insulation film GI, underlying electrodes Sx and Dx for the bottom gate bottom contact TFT 1). When the partition layer BK is made of monomolecular layer, the layer is preferably structured such that one end of the molecule has a high degree of adhesion to the underlying layer, and the other end is liquid-repellent The partition layer BK can be formed in such a manner that a film is formed of a partition layer material by a spin coating method, and the film is patterned by a photolithography method. Further, the PDMS plate can be used to transfer the partition layer material. In this case, the partition layer BK can be formed by adjusting the rigidity of the PDMS plate and transfer pressure.

The planar shape of the partition layer BK is made such that the partition layer surrounds the source electrode S, drain electrode D, and the channel portion therebetween. If some portion is not surrounded, the applied ink droplet may leak through that portion, which means that the partition layer BK does not perform its function as a partition layer. The planar shape of the partition layer BK surrounding the source electrode S and drain electrode D can be toroidal. It is also possible to arrange such a configuration that the partition layer BK is formed to have an opening in an area corresponding to at least the source electrode S, drain electrode D, and the channel portion between them, and is formed on all the surfaces of the underlying layer, as illustrated in the lower drawings of FIGS. 2a through 2c.

The source electrode S and drain electrode D are preferably made of the material having excellent characteristics of carrier injection into the semiconductor materials. Au is preferably used, as described above. In addition to Au, ITO and Pt having a greater work function can also be used for a p-type organic semiconductor. The source electrode S and drain electrode D can be formed by electric plating or electroless plating. However, an electroless plating method is preferably used for the TFT array 1A having source electrode S and drain electrode D which are isolated. A commonly used plating solution can be used, although it is essential to select the plating solution that does not give any damage to the partition layer BK.

There is no particular restriction to the material for the semiconductor film SF, as long as the material can be dissolved or dispersed in a solvent. It is possible to use a polycyclic aromatic compound or conjugate polymer. Further, other polymeric materials, oligomer or low-molecular material can also be used. It is particularly preferred to use materials in which the molecules are arranged regularly to be crystallized by intermolecular interaction. Examples of the material include pentacene, porphyrin, phthalocyanine, oligothiophene, oligophenylene, polythiophene, polyphenylene, and the derivatives thereof Specific examples include pentacene; 6,13-bis(triisopropylsilyl ethynyl) pentacene; tetrabenzoporphyrin; and poly(3-hexylthiophene). It is also possible to use precursors of semiconductor dissolved in a solvent. The organic/inorganic hybrid material or inorganic material can be used, as long as a semiconductor film SF is formed by coating with such a material simultaneously with the solvent and drying the solvent thereafter. As the solvent for the semiconductor materials, an organic solvent can be used For example, a solvent suitable as a solvent for the semiconductor materials can be selected from hydrocarbons such as toluene or xylylene, alcohols such as methanol or ethanol, ketones such as acetone or methyl ethyl ketone, from ethers such as diethylene glycol monomethyl ether, from esters such as ethyl acetate or butyl acetate, and from halogenated hydrocarbons such as chloroform or trichloro ethylene.

There is no particular restriction to the method of forming a semiconductor film SF, as long as the solution made by dissolving or dispersing the semiconductor material in a solvent can be applied in the vicinity of the channel portion. For example, the inkjet method can be used. In the opening of the partition layer BK, the source electrode S, the drain electrode D and the substrate P are exposed in the case of the top-gate bottom-contact type TFT 1; and the source electrode S, the drain electrode D and the gate insulation film GI are exposed in the case of the bottom-gate bottom-contact TFT 1. In these cases, the repellency to the ink is required to meet the following conditional expression (1). It is practical to use the solvent of the ink to measure the contact angle.

The contact angle with the partition layer BK> the contact angle with the source electrode S, the contact angle with the drain electrode D, and the contact angle with the substrate P or the gate insulation film GI . . . (1)

The difference between the contact angle with the partition layer BK and the contact angles with the source electrode S, the drain electrode D, and with substrate P or the gate insulation film GI are preferably 10° or more, more preferably, 20° or more. If there is a great difference between the contact angle with the partition layer BK and the contact angles with the source electrode S, the drain electrode D, and the substrate P or the gate insulation film GI, the ink is applied to the whole surface, and the application method may be a whole-surface printing method such as spin coating method, a dip coating method, or a slit coating method.

It is preferable that the difference among the contact angle with the source electrode S, that with the drain electrode D, and that with the substrate P or the gate insulation film GI is small. If this difference is large, the saturation (density) of ink is set at a higher level so that the semiconductor film SF is quickly formed just after the ink droplet has spread, after landing, inside the partition layer BK. Alternatively, the substrate temperature is set at a higher level at the time of dispensing ink so that the semiconductor film SF is quickly formed just after the ink droplet has spread, after landing, inside the partition layer BK.

The protective film PV (FIGS. 2b and 2c) can be formed in such a manner that a film is formed of the protective film material by a sputtering method and the film is patterned by a photolithography method. The inkjet method can also be used. The protective film PV can be formed by using inorganic materials such as $SiO_2$ or SiN, or organic materials such as PVA, PVP, polyimide resin or novolak resin. A plurality of these materials can be stacked on one another. The protective film PV is preferably made of materials that can be applied so that the protective film can be formed at the atmospheric pressure without using a vacuum process, thereby reducing production costs. For this reason, organic materials that can be used at a low temperature to make a film are more preferable. The protective film PV may not be necessary when the semiconductor material is sufficiently durable. The protective film PV can be formed such that it cover the whole surface of the substrate, on which the semiconductor film SF has been formed, and an opening is formed only in the region corresponding to the contact hole H (FIG. 2b). Alternatively, the opening can be formed only on the intersecting portion between the periphery, including the surface of the semiconductor film SF, and the bus line. If the opening is formed only on the periphery including the surface of the semiconductor film SF, the opening can be formed only on the surface of the semiconductor film SF by using the partition layer BK again (FIG. 2c). Further, the protective film PV corresponding to the intersecting portion of the bus line can be omitted by ensuring that the partition layer BK has a sufficient electrical insulation property.

The pixel electrode E can be formed in such a manner that a film is formed of a pixel electrode material by a sputtering method, and the film is patterned by a photolithography method. The pixel electrode E can also be formed by an inkjet method. The material of the pixel electrode E can be selected depending on the application of the TFT array 1A. ITO or ZnO can be used as the material for the transparent electrode. In the present embodiment, the pixel electrode E is formed in the top layer. However, the pixel electrode E can be formed in the same layer as the source electrode S and drain electrode D, or in the same layer as the gate electrode G. In this case, the number of processes can be reduced, and productivity can be enhanced by using the same material.

In the TFT array 1A with the aforementioned structure, to form the semiconductor film SF with an appropriate film thickness at a prescribed position with high accuracy, in the present embodiment, the partition layer BK is formed on the surface of the underlying layer (substrate P for the top-gate bottom-contact TFT 1, or gate insulation film GI for the bottom-gate bottom-contact TFT 1) including the underlying electrodes Sx and Dx on which the source electrode S and the drain electrode D are to be formed, instead of on the surface of the source electrode S and the drain electrode D. In this configuration, the partition layer BK is formed such that the partition layer surrounds the area, on the underlying electrodes Sx and Dx, on which the source electrode S and drain electrode D are to be formed. The source electrode S and drain electrode D is formed by a plating method on the surfaces of the underlying electrodes Sx and Dx surrounded by the partition layer BK.

To be more specific, the semiconductor film SF is not formed directly on the surfaces of the underlying electrodes Sx and Dx. Accordingly, the material of the underlying electrodes Sx and Dx can be selected by putting priority on the adhesion to the partition layer BK, without giving any consideration to the electrical compatibility with the semiconductor film SF. This will minimize the possibility of the partition layer BK being separated, or the durability being reduced, whereby the liquid-repellency required for the partition layer BK and stable performances are ensured.

In the meantime, the partition layer BK is not formed on the surfaces of the source electrode S and drain electrode D. Accordingly, the material of the source electrode S and drain electrode D can be selected by putting priority on the electric compatibility with the semiconductor film SF, without giving any consideration to adhesion to the partition layer BK. Thus, the material most compatible to the semiconductor film SF can be used as the material for the source electrode S and drain electrode D, with the result that TFT performances are enhanced.

The following describes the Examples of the present embodiment.

EXAMPLES

Example 1

Referring to FIGS. 3a-3g, the following describes the method of manufacturing a top-gate bottom-contact TFT array. FIGS. 3a through 3g are schematic diagrams showing the process of manufacturing the top-gate bottom-contact TFT array 1A of the present Example. In FIGS. 3a through 3g, the schematic plan views are shown on the left. The right drawings are the schematic views showing the cross sections along arrows A-A' of the left drawings. For ease of explanation, some of the components are not illustrated. Further, transparent views are used to illustrate some portions.

In this Example, a 50 mm×50 mm square substrate P was used to produce a TFT array 1A for an electronic paper having 20 x 20 pixels Px with a resolution of 60 dpi, wherein each pixel Px was provided with one TFT 1.

Figure 3A:
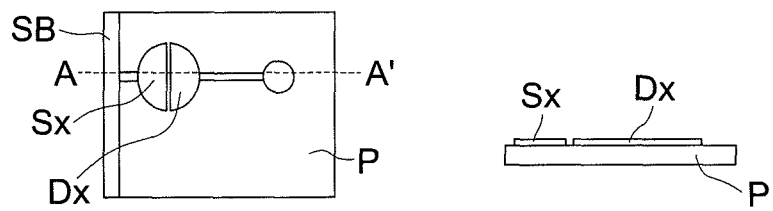
FIGS. 3a-3g are schematic diagrams showing steps of manufacturing a top-gate bottom-contact TFT according to the present embodiment.

In the first place, glass was used as the substrate P, and a resist film was formed on the substrate wherein this resist was used to form an underlying electrodes Sx and Dx, and a source bus SB on the substrate P by a lift-off method. After that, an Ni film having a thickness of 50 nm was formed by a sputtering method. Then the resist was stripped with the stripping solution containing a major component of NMP. Thus, the underlying electrodes Sx and Dx, and source bus SB were formed (FIG. 3a).

Figure 3B:
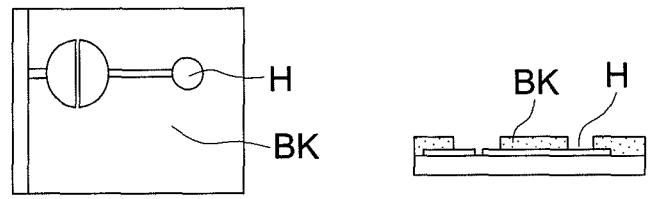

Then, a spin coating method was used to apply the photosensitive bank agent NPAR-502 (produced by Nissan Chemical Industries, Ltd.; acryl resin added with fluorine-based surface active agent) as the material for the partition layer BK. After that, patterning was performed by a photolithography method to form a partition layer BK having a thickness of 500 nm (FIG. 3b). In this case, the partition layer BK was formed such that the partition layer surrounds the area in which the source electrode S and drain electrode D were to be formed on the surfaces of the underlying electrodes Sx and Dx, and the opening was formed in a circular shape having a radius of 50 μm. Further, in this step, a contact hole was formed to connect the electrode for connecting pixel-electrode EC and the pixel electrode E. The opening was formed in a circular shape having a radius of 30 μm. Thus, the partition layer BK was formed on the surfaces of two different materials: an Ni film (underlying electrodes Sx and Dx); and glass (substrate P), whereby a highly stable partition layer BK with a high degree of adhesion to these two materials was formed on the both materials.

Figure 3C:
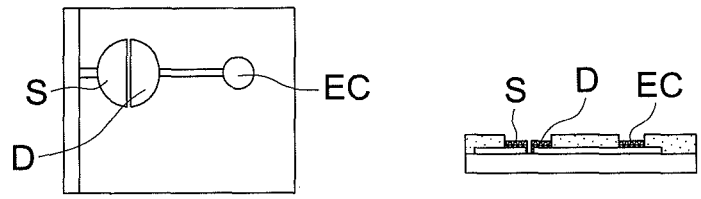
Figure 3D:
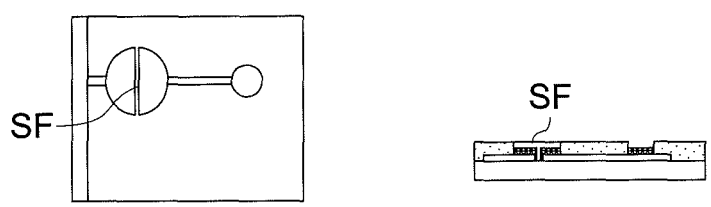

At the next step, an electroless plating method was used to plate Au on the surfaces of the underlying electrodes Sx and Dx, which are surrounded by the partition layer BK, and on the region corresponding to the contact hole H for the underlying electrode Dx, whereby the source electrode S, drain electrode D and electrode for connecting pixel-electrode EC were formed (FIG. 3c). The plating process was performed in two steps: replacement plating from Ni to Au; and autocatalytic plating of Au, thereby forming a compact Au electrode with minimized pinholes. To put it more specifically, the substrate P was immersed in the replacement Au plating solution Flash Gold NC (produced by Okuno Chemical Industries Co., Ltd.) for 10 minutes to form a replaced Au plated layer, and was then immersed in the autocatalytic electroless Au plating solution Self-Gold OTK-SD (produced by Okuno Chemical Industries, Ltd.) for 10 minutes to form a catalytic electroless Au plated layer.

Then, as the materials for the semiconductor film SF, the solution of tetrabenzoporphyrin precursor was applied to the area surrounded by the partition layer BK by an inkjet method, thereby forming the semiconductor film SF (FIG. 3d), wherein the amount of liquid droplet was of 4 pico liter. The semiconductor film SF was formed under the $N_2$ atmosphere and was heated up to 200° C. for crystallization. As a result, for all the 20×20 TFT 1, the semiconductor films SF were formed inside the partition layer BK with high accuracy.

Figure 3E:
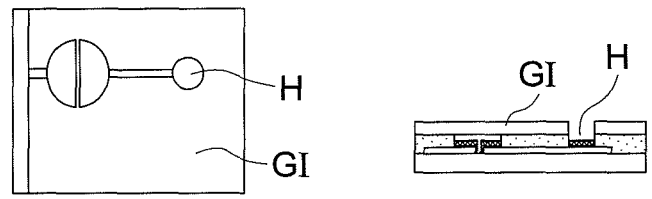

An $SiO_2$ film was formed to have a thickness of 100 nm by a sputtering method, and the PC403 (produced by JSR Corporation) was used to form on this film a resist film having an opening at the position corresponding to the contact hole H to be formed in the gate insulation film GL Then, the $SiO_2$ film was etched by using a dry etching method. Through these steps, the gate insulation film GI having contact hole H was formed (FIG. 3e).

Figure 3F:
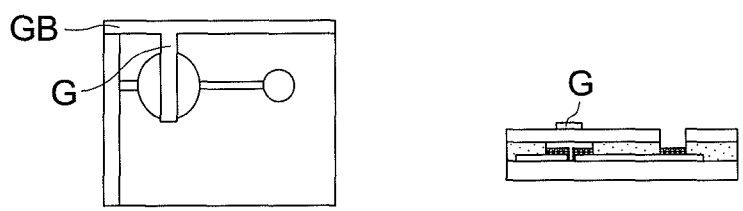

By using an inkjet method, Silver Nano-Ink (produced by Harima Chemicals Inc.) is applied to form a gate electrode G and a gate bus GB (FIG. 3f).

Figure 3G:
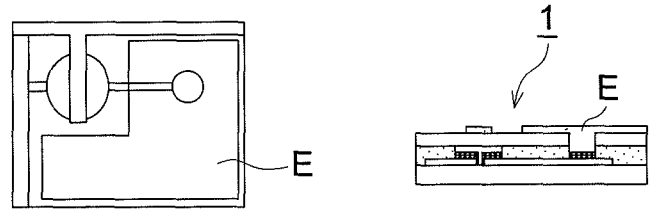

Finally, by using an inkjet method, ITO nano-ink containing ITO nano-particles is applied to form a transparent pixel electrode E. At this step, the electrode for connecting pixel-electrode EC and the pixel electrode E were connected, whereby formation of a TFT array 1A was completed (FIG. 3g).

It was confirmed that in the TFT array 1A manufactured by the aforementioned process, the partition layer BK had an excellent adhesion to the substrate P and the underlying electrodes Sx and Dx; therefore, the semiconductor film SF having an appropriate thickness was formed at a prescribed position with high accuracy.

Example 2-1

Referring to FIGS. 4a-4h, the following describes the method of manufacturing a bottom-gate bottom-contact TFT array. FIGS. 4a through 4h are schematic diagrams showing the process of manufacturing the bottom-gate bottom-contact TFT array 1A of the present Example. In FIGS. 4a through 4h, the schematic plan views are shown on the left. The right drawings are the schematic views showing the cross sections along arrows A-A' of the left drawings. For ease of explanation, some of the components are not illustrated. Further, transparent views are used to illustrate some portions.

In this Example, a 50 mm×50 mm square substrate P was used to produce a TFT 1 array 1A for an electronic paper having 20×20 pixels Px with a resolution of 60 dpi, wherein each pixel Px was provided with one TFT 1.

Figure 4A:
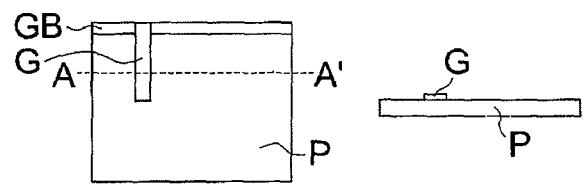
FIGS. 4a-4h are schematic diagrams showing steps of manufacturing a bottom-gate bottom-contact TFT according to the present embodiment.

In the first place, glass was used as the substrate P, and a Cr film with a thickness of 50 nm was formed on this glass by a sputtering method. After that, patterning was performed by a photolithography method to form a gate electrode G and a gate bus GB (FIG. 4a).

Figure 4B:
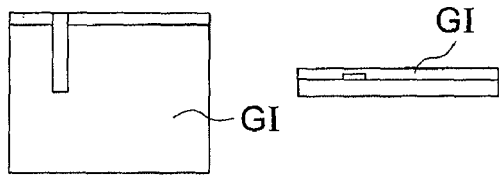

Then a film was formed of a phenol resin film by a spin coating method. After that, patterning was performed by a photolithography method to form a gate insulation film GI (FIG. 4b).

Figure 4C:
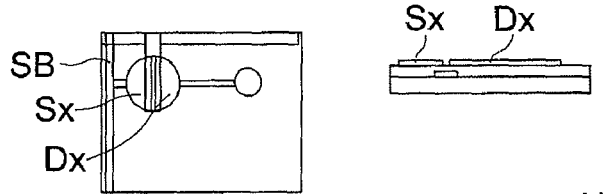

Then, a resist film was formed to be used to form underlying electrodes Sx and Dx and a source bus SB by a lift-off method. After that, an Ni film having a thickness of 50 nm was formed by an RF sputtering method. Then the resist was stripped with the stripping solution containing a major component of NMP. Thus, the underlying electrodes Sx and Dx, and source bus SB were formed (FIG. 4c).

Figure 4D:
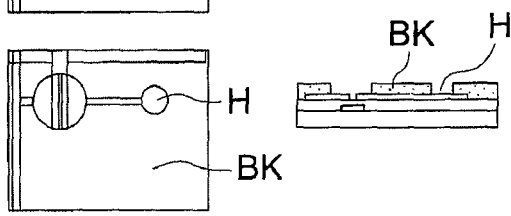

Then, a spin coating method was used to apply the photosensitive bank agent NPAR-502 (produced by Nissan Chemical Industries, Ltd.). After that, patterning was performed by a photolithography method to form a partition layer BK having a thickness of 500 nm (FIG. 4d). In this case, the partition layer BK was formed such that the partition layer surrounds the area in which the source electrode S and drain electrode D were to be formed on the surfaces of the underlying electrodes Sx and Dx, and the opening was formed in a circular shape having a radius of 50 μm. Further, in this step, a contact hole H was formed to connect the electrode for connecting pixel-electrode EC and the pixel electrode E. The opening was formed in a circular shape having a radius of 30 μm. Thus, the partition layer BK was formed on the surfaces of two different materials: an Ni film (underlying electrodes Sx and Dx); and phenol resin firm (gate insulation film GI), whereby a highly stable partition layer BK with a high degree of adhesion was formed on the both materials.

Figure 4E:
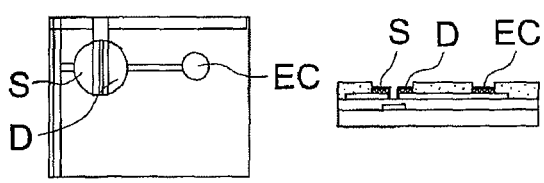
Figure 4F:
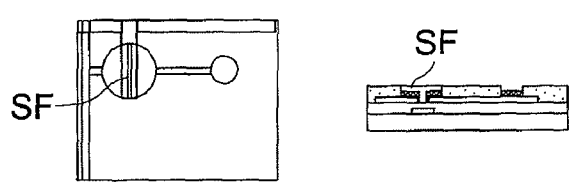

At the next step, an electroless plating method was used to plate Au on the surfaces of the underlying electrodes Sx and Dx, which are surrounded by the partition layer BK, and on the region corresponding to the contact hole H for the underlying electrode Dx, whereby the source electrode S, drain electrode D and electrode for connecting pixel-electrode EC were formed (FIG. 4e). The plating process was performed in two phases: replacement plating from Ni to Au; and autocatalytic plating of Au, thereby forming a compact Au electrode with minimized pinholes. To put it more specifically, the substrate P was immersed in the replacement Au plating solution Flush Gold NC (produced by Okuno Chemical Industries Co., Ltd.) for 10 minutes to form a replaced Au plated layer, and was immersed in the autocatalytic electroless Au plating solution Self-Gold OTK-SD (produced by Okuno Chemical Industries Co., Ltd.) for 10 minutes to form a catalystic electroless Au plated layer.

Then, as the materials for the semiconductor film SF, the solution of tetrabenzoporphyrin precursor was applied to the area surrounded by the partition layer BK by an inkjet method, thereby forming the semiconductor film SF (FIG. 4f), wherein the amount of liquid droplet was of 4 pico liter. The semiconductor film SF was formed under the $N_2$ atmosphere and was heated up to 200° C. for crystallization. As a result, for all the 20×20 TFT 1, the semiconductor films SF were formed inside the partition layer BK with high accuracy.

Figure 4G:
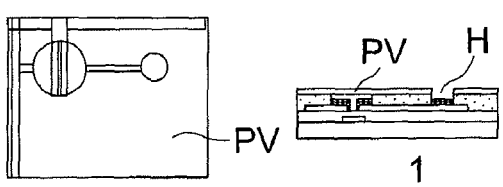

An $SiO_2$ film was formed to have a thickness of 100 nm by a sputtering method, and the PC403 (produced by JSR Corporation) was formed on this film as a resist film having an opening at the position corresponding to the contact hole H to be formed in the protective film GI. The $SiO_2$ film was etched by using a dry etching method. Through these steps, the protective film PV having contact hole H was formed (FIG. 4g).

Figure 4H:
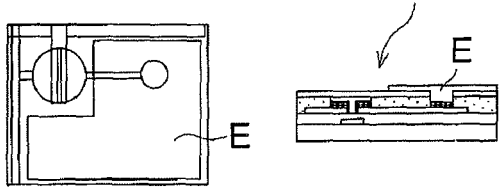

Finally, by using an inkjet method, ITO nano-ink containing ITO nano-particles is applied to form a transparent pixel electrode E. At this step, the electrode for connecting pixel-electrode EC and the pixel electrode E were connected, whereby formation of a TFT array 1A was completed (FIG. 4h).

It was confirmed that in the TFT array 1A manufactured by the aforementioned process, the partition layer BK had an excellent adhesion to the gate insulation film GI and the underlying electrodes Sx and Dx; therefore, the semiconductor film SF having an appropriate thickness was formed at a prescribed position with high accuracy.

Example 2-2

Referring to FIGS. 5a and 5b, the following describes the Example 2-2 of a method for producing a bottom-gate bottom-contact TFT array. FIGS. 5a and 5b are the schematic diagrams representing some of the steps of manufacturing the bottom-gate bottom-contact TFT array 1A in the present Example. For ease of explanation, some of the components are not illustrated. Further, transparent drawings are used to illustrate some portions.

The production method in the present Example 2-2 is approximately the same as that of the Example 2-1. The only difference is in the shape of the protective film and method of forming this film. To be more specific, the steps (FIGS. 4a through 4f) up to the step of forming the semiconductor film SF are the same as those of Example 2-1, and will not be described. The following describes the steps of forming the protective film PV and the following steps.

Using an inkjet method, the solution obtained by dissolving the polyimide resin in the solvent containing NMP as a major component was applied to the area, surrounded by the partition layer BK, on the substrate (FIG. 4f) on which the semiconductor film SF had been formed, whereby the protective film PV was formed (FIG. 5a). At this step, the protective film PV was formed only on the surface of the semiconductor film SF due to the partition layer BK.

A transparent pixel electrode E was formed in the same process as in the Example 2-1. In this process, the electrode for connecting pixel-electrode EC and pixel electrode E were connected, and the production of TFT array 1A was completed (FIG. 5b).

It was confirmed that in the TFT array 1A manufactured by the aforementioned process, the partition layer BK had an excellent adhesion to the gate insulation film GI and the underlying electrodes Sx and Dx; therefore, the semiconductor film SF having an appropriate thickness was formed at a prescribed position with high accuracy.

As described above, in the present embodiments, the partition layer BK is not formed on the surface of the source electrode S or the drain electrode D, but is formed such that the partition layer surrounds the area which is on the underlying layer and in which the source electrode S and the drain electrode D are to be formed. In addition, the source electrode S and drain electrode D are formed, by a plating method, on the surfaces of the underlying electrodes Sx and Dx surrounded by the partition layer BK.

Therefore, the material for the underlying electrodes Sx and Dx can be selected while putting priority on the adhesion to the partition layer BK, without giving any consideration to the electrical compatibility with the semiconductor film SF. This minimizes the possibility of the partition layer BK being separated, or the durability being reduced.

In the meantime, the material of the source electrode S and drain electrode D can be selected while putting priority on the electric compatibility with the semiconductor film SF, without giving any consideration to adhesion to the partition layer BK. Thus, the materials (for example, Au) suitable for the semiconductor film SF can be used, with the result that TFT 1 performances are enhanced.

When the source electrode S and drain electrode D are formed by a plating method, the plating can be performed using the partition layer BK as a mask. This allows only the required region to be plated, without wasting the material, thereby enhancing productivity As a result, the semiconductor film SF is formed to have an appropriate thickness at a prescribed position with high accuracy, and the performances and the productivity of the TFT are enhanced.

In the TFT array 1A of the present embodiment, the region occupied by the source electrode S, drain electrode D and channel portion is made in an approximately circular shape. Therefore, the ink is steadily landed inside the partition layer BK by an inkjet method, and the deterioration of the performances due to the dissolution of the material of the partition layer into the ink is decreased. Further, this structure ensures uniform drying of ink in the region surrounded by the partition layer BK, and thereby reducing the fluctuation in the performances among different TFTs 1.

In the TFT array 1A of the present embodiment, the step of applying ink to form a semiconductor film can be implemented in a closed space such as in a glove box, which is isolated from the outside.

The coating type semiconductor material is generally easily affected by moisture or oxygen. Thus, the coating type semiconductor material is preferably applied and dried in an environment with a minimum amount of moisture and oxygen, and it is preferable to form a protective film in the environment. Thus, it is most preferred that the semiconductor material should be applied in a closed space such as in a glove box. However, if the material is applied in a closed space, that space will become an atmosphere of the vaporized solvent of the ink. When the partition layer BK is to be formed directly on the source electrode S and drain electrode D, there will be a difference (reduction in liquid-repellency) in the degree of effect of the atmosphere of ink solvent between the partition layer BK formed on the surfaces of the source electrode S or the drain electrode D, and the partition layer BK formed on the surfaces of other members.

With the structure of the TFT array 1A of the present embodiment, the partition layer BK is formed on the surfaces of the underlying electrode Sx and Dx, the substrate P or the gate insulation film GI, not on the surfaces of the source electrode S or drain electrode D. This ensures a high degree of adhesion of the partition layer BK, and formation of a rigid liquid-repellent thin film, with the result that no problem occurs due to the atmosphere containing the ink solvent This allows the step of applying ink to be performed in a closed environment separated from the outside.

Description of Numerals

1A TFT array
1 TFT
BK Partition layer
D Drain electrode
E Pixel electrode
EC Electrode for connecting pixel-electrode
G Gate electrode
GI Gate insulation film
H Contact hole
HL (GB) Row selection line (gate bus)
P Substrate
PV Protective film
Px Pixel
S Source electrode
Sx, Dx Underlying electrode
SF Semiconductor film
VL (SB) Column selection line (source bus)

The invention claimed is:

1. A method of manufacturing a thin film transistor including a source electrode, a drain electrode, a gate electrode, and a semiconductor layer formed in a channel portion between the source electrode and the drain electrode, the method comprising the steps of:

forming a pair of underlying electrodes on a surface of an underlying layer;

forming a partition layer on both the surface of the underlying layer and a first part of a surface of the respective underlying electrode such that the partition layer surrounds an area in which the source electrode, the drain electrode, and the channel portion are to be formed;

forming the source electrode and the drain electrode, in the area surrounded by the partition layer, by covering a second part of the surface of the respective underlying electrode, the second part being an area on the surface of the respective underlying electrode not covered by the partition layer, forming the source electrode and the drain electrode thereby defining the channel portion between the source electrode and the drain electrode; and applying a semiconductor solution to the area surrounded by the partition layer to form the semiconductor layer, the semiconductor solution containing a solvent and a semiconductor material dissolved or dispersed in the solvent.

2. The method of claim 1, wherein the source electrode and the drain electrode are formed by a plating method.

3. The method of claim 1, wherein the source electrode and the drain electrode contain Au.

4. The method of claim 3, wherein the underlying electrodes contain Ni.

5. The method of claim 1, wherein the semiconductor material includes an organic semiconductor material.

6. The method of claim 1, wherein in the step of applying a semiconductor solution, the semiconductor solution is applied by an inkjet method.

7. The method of claim 1, wherein the underlying layer contains an organic material.

8. The method of claim 1, wherein the partition layer contains polymeric material.

9. The method of claim 1, wherein the area has a planar circular shape.

10. The method of claim 1, wherein the thin film transistor has a top-gate bottom-contact structure, and the underlying layer is a substrate.

11. The method of claim 1, wherein the thin film transistor has a bottom-gate bottom-contact structure, and the underlying layer is a gate insulation film configured to cover a gate electrode formed on a substrate.

12. The method of claim 1, wherein the semiconductor layer is applied in a closed environment.

13. The method of claim 1, wherein the source electrode and the drain electrode are formed by an electroless plating method.

14. The method of claim 1, wherein the semiconductor solution has a larger contact angle with the partition layer than with the source electrode, the drain electrode and the underlying layer.

15. The method of claim 14, wherein the contact angle of the semiconductor material with the partition layer is at least 20 degrees larger than contact angles with the source electrode, the drain electrode and the underlying layer.

16. The method of claim 1, wherein the underlying electrodes are formed of a material whose degree of adhesion to the partition layer is higher than a degree of adhesion of a material of the source electrode and the drain electrode to the partition layer.

17. The method of claim 1, wherein the first part and the second part cover all of the surfaces of the respective underlying electrodes.

18. A thin film transistor including a source electrode, a drain electrode, a gate electrode, and a semiconductor layer formed in a channel portion between the source electrode and the drain electrode, said thin film transistor comprising:
  an underlying layer;
  a pair of underlying electrodes formed on a surface of the underlying layer, a surface of respective underlying electrodes including a first part and a second part, the first part being configured to hold thereon a partition layer and the second part being configured to hold thereon the source electrode and the drain electrode respectively, the source electrode and the drain electrode defining the channel portion therebetween;
  a partition layer formed on both the surface of the underlying layer and the first part of the surface of the respective underlying electrode such that the partition layer surrounds the source electrode, the drain electrode and the channel portion, the source electrode and the drain electrode being formed on the second part of the surface of the respective underlying electrode, the second part being an area on the surface of the respective underlying electrode not covered by the partition layer; and
  a semiconductor layer formed in the channel portion.

19. The thin film transistor of claim 18, wherein the source electrode and the drain electrode contain Au.

20. The thin film transistor of claim 18, wherein the underlying electrodes contain Ni.

21. The thin film transistor of claim 18, wherein the underlying layer contains an organic material.

22. The thin film transistor of claim 18, wherein the partition layer contains a polymeric material.

23. The thin film transistor of claim 18, wherein the source electrode, the drain electrode, and the channel portion form a planar circular shape.

24. The thin film transistor of claim 18, wherein the thin film transistor has a top-gate bottom-contact structure, and the underlying layer is a substrate.

25. The thin film transistor of claim 18, wherein the thin film transistor has a bottom-gate bottom-contact structure, and the underlying layer is a gate insulation layer configured to cover a gate electrode formed on a substrate.

26. The thin film transistor of claim 18, wherein the underlying electrodes are formed of a material whose degree of adhesion to the partition layer is higher than a degree of adhesion of a material of the source electrode and the drain electrode to the partition layer.

27. The thin film transistor of claim 18, wherein the first part and the second part cover all of the surfaces of the respective underlying electrodes.

28. A method of manufacturing a thin film transistor including an underlying layer, a source electrode, a drain electrode, a gate electrode, and a semiconductor layer formed in a channel portion between the source electrode and the drain electrode, the method comprising, in order, the steps of:
  forming a first underlying electrode and a second underlying electrode on a surface of the underlying layer;
  forming a partition layer having an opening therein on the surface of the underlying layer, a first surface of the first underlying electrode, and a first surface of the second underlying electrode, wherein the opening includes a second surface of the first underlying electrode, a second surface of the second underlying electrode, and part of the surface of the underlying layer therebetween;
  forming the source electrode and the drain electrode by covering the second surface of the first underlying electrode in the opening and the second surface of the second underlying electrode in the opening, respectively, the second surface of the first underlying electrode and the second surface of the second underlying electrode are areas not covered by the partition layer, forming the source electrode and the drain electrode thereby defining the channel portion between the source electrode and the drain electrode; and
  applying a semiconductor solution to the surface of the underlying layer in the opening, the semiconductor solution containing a solvent and a semiconductor material dissolved or dispersed in the solvent.

* * * * *